United States Patent
Kobayashi

(10) Patent No.: US 9,837,337 B2
(45) Date of Patent: Dec. 5, 2017

(54) WIRING SUBSTRATE, METHOD OF MANUFACTURING THE SAME AND ELECTRONIC COMPONENT DEVICE

(71) Applicant: SHINKO ELECTRIC INDUSTRIES CO., LTD., Nagano-shi, Nagano (JP)

(72) Inventor: Kazutaka Kobayashi, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 136 days.

(21) Appl. No.: 14/950,762

(22) Filed: Nov. 24, 2015

(65) Prior Publication Data
US 2016/0157345 A1  Jun. 2, 2016

(30) Foreign Application Priority Data
Nov. 27, 2014 (JP) .................. 2014-239557

(51) Int. Cl.
*H05K 7/10* (2006.01)
*H05K 7/12* (2006.01)
*H01L 23/495* (2006.01)
*H01L 21/48* (2006.01)
*H01L 23/31* (2006.01)

(52) U.S. Cl.
CPC .... *H01L 23/49503* (2013.01); *H01L 21/4828* (2013.01); *H01L 23/49517* (2013.01); *H01L 23/49548* (2013.01); *H01L 23/49558* (2013.01); *H01L 23/3121* (2013.01); *H01L 2224/32225* (2013.01); *H01L 2224/32245* (2013.01); *H01L 2224/45144* (2013.01); *H01L 2224/48091* (2013.01); *H01L 2224/48227* (2013.01); *H01L 2224/48247* (2013.01); *H01L 2224/73204* (2013.01); *H01L 2224/73265* (2013.01); *H01L 2924/181* (2013.01)

(58) Field of Classification Search
CPC ....... H01L 2924/00; H01L 2224/73265; H01L 2224/32225; H01L 2224/32245; H01L 2224/45144; H01L 2224/48091; H01L 2224/48227; H01L 2224/48247; H01L 2924/181; H01L 2924/00012; H01L 2924/00014
See application file for complete search history.

(56) References Cited

U.S. PATENT DOCUMENTS 6,208,525 B1 * 3/2001 Imasu .................. H01L 21/563
174/255
2001/0048166 A1 * 12/2001 Miyazaki ............. H01L 21/568
257/778

(Continued)

FOREIGN PATENT DOCUMENTS

JP   11-354673   12/1999
JP   11354673    * 12/1999

*Primary Examiner* — Yuriy Semenenko
(74) *Attorney, Agent, or Firm* — Rankin, Hill & Clark LLP

(57) ABSTRACT

A wiring substrate includes an electronic component mounting pad, an electrode pad arranged at an outer side of the electronic component mounting pad, a first insulation layer formed on the electronic component mounting pad and the electrode pad, an opening formed in the first insulation layer on the electronic component mounting pad, a connection hole formed in the first insulation layer on the electrode pad, and recess portions formed at the electronic component mounting pad in the opening and at the electrode pad in the connection hole, respectively.

12 Claims, 25 Drawing Sheets

(56) References Cited

U.S. PATENT DOCUMENTS

2007/0045867 A1* 3/2007 Machida .............. H01L 21/563
 257/778
2010/0258934 A1* 10/2010 Chang Chien ...... H01L 21/4832
 257/690

* cited by examiner

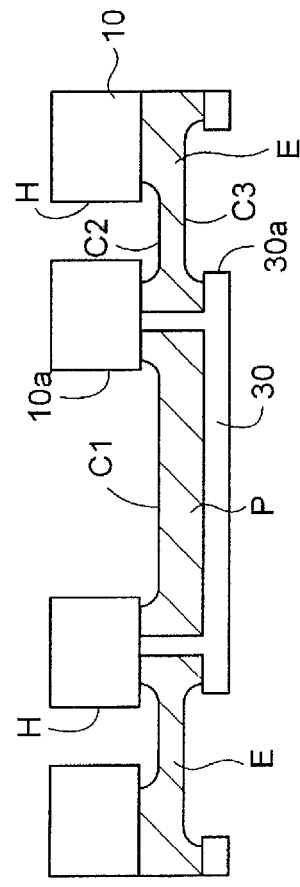
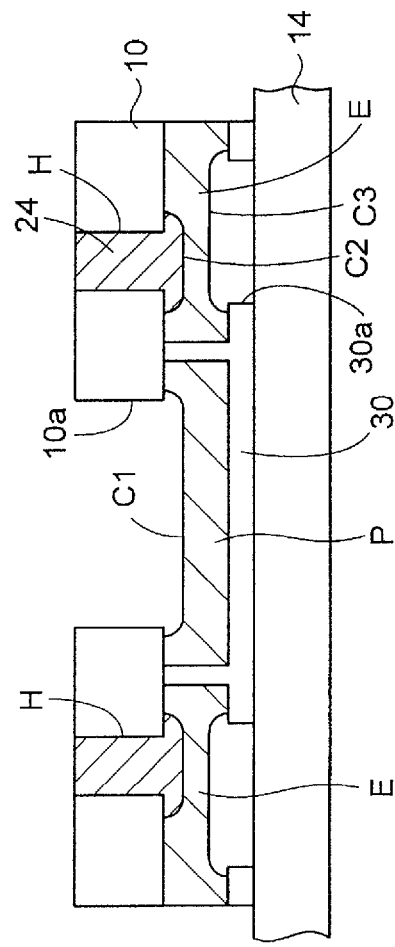

WIRING SUBSTRATE, METHOD OF MANUFACTURING THE SAME AND ELECTRONIC COMPONENT DEVICE

CROSS-REFERENCE TO RELATED APPLICATION

The present application claims priority from Japanese Patent Application No. 2014-239557 filed on Nov. 27, 2014, the entire content of which is incorporated herein by reference.

BACKGROUND

Technical Field

The present disclosure relates to a wiring substrate, a method of manufacturing the same and an electronic component device.

Related Art

In the related art, an electronic component device where electronic components such as a semiconductor chip and the like are mounted on a wiring substrate has been known. In an example of the wiring substrate of the electronic component device, a substrate made of a glass epoxy resin is formed with through-holes, and both surfaces of the substrate are formed with wiring layers that are connected to each other via through-electrodes in the through-holes.

In recent years, as the electronic component device is made to be smaller and thinner, a technology for thinning the wiring substrate is required.

[Patent Document 1] Japanese Patent Application Publication No. Hei 11-354673A

As described in paragraphs of a preliminary technology (which will be described later), for the wiring substrate of the electronic component device, the wiring layer is prepared using the substrate of the glass epoxy resin. However, since it is technically limited to thin a thickness of each layer of the wiring substrate, it is difficult to cope with the needs for the thinning.

SUMMARY

Exemplary embodiments of the invention provide a wiring substrate that can be made to be thin, a method of manufacturing the same and an electronic component device.

A wiring substrate according to a first aspect of the invention comprises:

an electronic component mounting pad;
an electrode pad arranged at an outer side of the electronic component mounting pad;
a first insulation layer formed on the electronic component mounting pad and the electrode pad;
an opening formed in the first insulation layer on the electronic component mounting pad;
a connection hole formed in the first insulation layer on the electrode pad; and
recess portions formed at the electronic component mounting pad in the opening and at the electrode pad in the connection hole, respectively.

An electronic component device according to a second aspect of the invention comprises:

an electronic component mounting pad;
an electrode pad arranged at an outer side of the electronic component mounting pad;
a first insulation layer formed on the electronic component mounting pad and the electrode pad;
an opening formed in the first insulation layer on the electronic component mounting pad;
a connection hole formed in the first insulation layer on the electrode pad;
recess portions formed at the electronic component mounting pad in the opening and at the electrode pad in the connection hole, respectively;
an electronic component mounted on the electronic component mounting pad; and
a metallic wire connecting the electronic component and the electrode pad each other.

A method of manufacturing a wiring substrate according to a third aspect of the invention, the method comprises:

forming an opening and a connection hole at an outer side of the opening in a resin film by a penetrating process;
bonding a metal foil to one surface of the resin film;
patterning the metal foil to arrange an electronic component mounting pad in an area comprising the opening of the resin film and to arrange an electrode pad in an area comprising the connection hole of the resin film; and
forming recess portions at the electronic component mounting pad in the opening of the resin film and at the electrode pad in the connection hole of the resin film, respectively.

According to the below disclosure, in the wiring substrate of the electronic component device, the first insulation layer is formed on the electronic component mounting pad and the electrode pad arranged at the outer side thereof. The first insulation layer has the opening on the electronic component mounting pad and has the connection hole on the electrode pad.

Also, the recess portions are respectively formed at the electronic component mounting pad in the opening of the first insulation layer and at the electrode pad in the connection hole.

Thereby, since it is possible to reduce a thickness of the electronic component mounting pad in the opening of the first insulation layer and to increase thicknesses of the electronic component mounting pad and the electrode pad at the parts covered by the first insulation layer, it is possible to secure predetermined stiffness of the wiring substrate.

Since the electronic component is mounted on the electronic component mounting pad so that it protrudes from an upper surface of the first insulation layer, a substantial thickness of the wiring substrate in the electronic component device is a thickness of the electronic component mounting pad.

Thereby, since it is possible to reduce the thickness of the wiring substrate in the electronic component device, it is possible to make the electronic component device thin.

BRIEF DESCRIPTION OF THE DRAWINGS

FIGS. 17A and 17B are sectional views depicting a method of manufacturing a wiring substrate according to a second exemplary embodiment.

DETAILED DESCRIPTION

Hereinafter, exemplary embodiments will be described with reference to the accompanying drawings.

Figure 1:
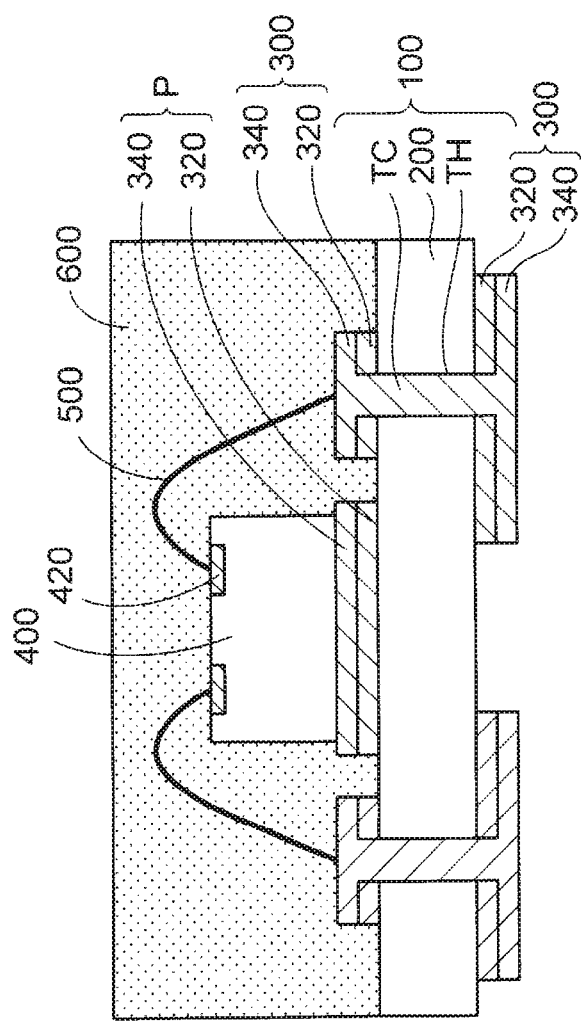
FIG. 1 is a sectional view for illustrating an electronic component device relating to a preliminary technology.

Before describing the exemplary embodiments, a preliminary technology, which is a basis of the disclosure, is first described. FIG. 1 is a sectional view depicting an electronic component device relating to the preliminary technology.

As shown in FIG. 1, according to a wiring substrate 100 of an electronic component device, a substrate 200 made of a glass epoxy resin is formed with through-holes TH.

Both surfaces of the substrate 200 are respectively formed with wiring layers 300 connected to each other via through-conductors TC in the through-holes TH. The wiring layer 300 has a copper foil 320 and a copper-plated layer 340 formed sequentially from below. The copper-plated layer 340 is connected to the through-conductor TC.

An electronic component mounting pad P is formed on a central part of an upper surface of the substrate 200. The electronic component mounting pad P has the same layers as the wiring layer 300, i.e., has the copper foil 320 and the copper-plated layer 340.

On the electronic component mounting pad P, an electronic component 400 is mounted with connection electrodes 420 of the electronic component 400 facing upwards.

The connection electrodes 420 of the electronic component 400 are electrically connected to the wiring layer 300 of the upper surface of the wiring substrate 100 by metallic wires 500. Also, the electronic component 400 and the metallic wires 500 are sealed by an encapsulant resin 600.

Here, typical thicknesses of the respective elements of the wiring substrate 100 are as follows: a thickness of the substrate 200: 50 µm, a thickness of the copper foils 320 of both sides: 36 µm (18 µm+18 µm), a thickness of the copper-plated layers 340 of both sides: 20 µm (10 µm+10 µm). Therefore, a typical total thickness of the wiring substrate 100 is 106 µm.

In recent years, as the electronic component device is made to be smaller and thinner, a technology for thinning the wiring substrate 100 is required. However, according to the wiring substrate 100 of the electronic component device of the preliminary technology shown in FIG. 1, since it is technically limited to thin the thicknesses of the substrate 200, the copper foil 320 and the copper-plated layer 340, it is difficult to cope with the needs for the thinning.

The exemplary embodiments to be described later can solve the above problems.

First Exemplary Embodiment

FIGS. 2 to 14 depict a wiring substrate and an electronic component device of a first exemplary embodiment. In the below, structures of the wiring substrate and the electronic component device are described while describing methods of manufacturing the wiring substrate and the electronic component device.

Figure 2:
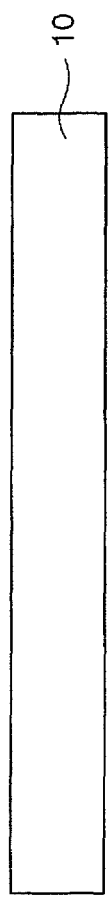
FIG. 2 is a sectional view depicting a method of manufacturing a wiring substrate according to a first exemplary embodiment.

According to the method of manufacturing the wiring substrate of the first exemplary embodiment, as shown in FIG. 2, a polyimide film 10 having a thickness of about 25 µm to 50 µm is first prepared.

A lower surface of the polyimide film 10 is provided with an adhesive (not shown) made of a thermosetting epoxy resin and the like. The polyimide film 10 is a favorable example of a first insulation layer. In addition to the polyimide film 10, a variety of resin films such as polyester, LCP (Liquid Crystal Polymer) and the like may also be used.

Figure 3:
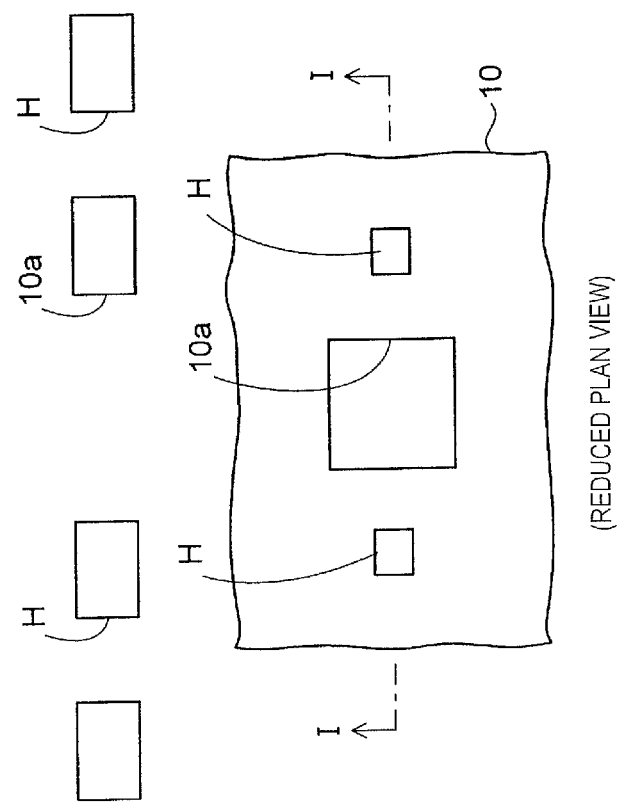
FIG. 3 is a sectional view and a reduced plan view depicting the method of manufacturing the wiring substrate according to the first exemplary embodiment.

Then, as shown in FIG. 3, the polyimide film 10 is subject to a penetrating process, more specifically, the polyamide film 10 is punched in a thickness direction by a mold punch (not shown). Thereby, an opening 10a is formed at a central part of one product area and connection holes H are formed at outer areas facing each other with the opening 10a being interposed therebetween.

A reduced plan view of FIG. 3 is a pictorial view of a sectional view of FIG. 3, as seen from above. Also, a section taken along a line I-I of the reduced plan view of FIG. 3 corresponds to the sectional view of FIG. 3. This also applies to the below.

In FIG. 3, an area of the polyimide film 10 corresponding to one product area is shown. Actually, a plurality of product areas is aligned and defined.

Figure 4:
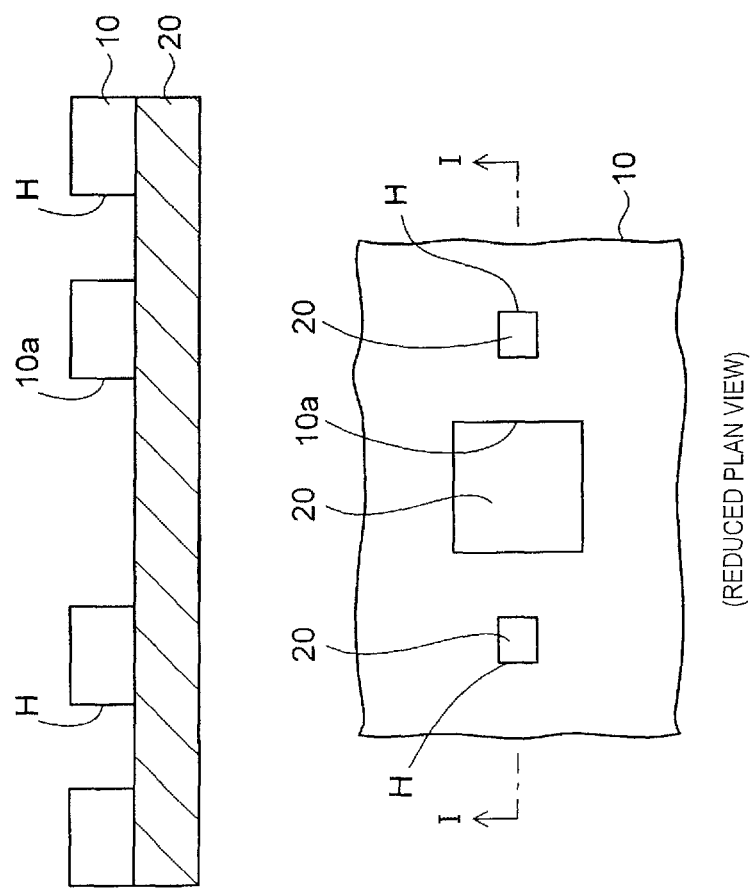
FIG. 4 is a sectional view and a reduced plan view depicting the method of manufacturing the wiring substrate according to the first exemplary embodiment.

As shown in a sectional view and a reduced plan view of FIG. 4, a copper foil 20 is bonded to one surface (lower surface) of the polyimide film 10.

A thickness of the copper foil 20 is 18 μm to 35 μm, for example. By heating and pressing the copper foil and the polyimide film 10 at about 150° C., the adhesive (not shown) on the lower surface of the polyimide film 10 is softened, so that the copper foil 20 is bonded to the polyimide film 10. Thereafter, the adhesive is cured by performing the heating treatment at about 150° C. for about one hour.

The copper foil 20 is an example of the metal foil, and a metal foil of another metal may also be used. Alternatively, a thin metal plate may be used.

Figure 5:
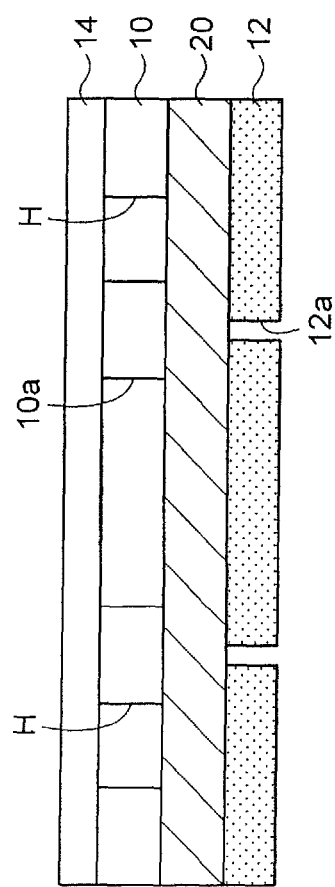
FIG. 5 is a sectional view depicting the method of manufacturing the wiring substrate according to the first exemplary embodiment.

Then, as shown in FIG. 5, a resist layer 12 having openings 12a for patterning the copper foil 20 is formed on a lower surface of the copper foil 20 by a photolithography. Also, a protective film 14 is bonded to an upper surface of the polyimide film 10.

Then, the resist layer 12 is used as a mask to remove the copper foil 20 through the openings 12a by a wet etching. Then, the resist layer 12 and the protective film 14 are removed.

Figure 6:
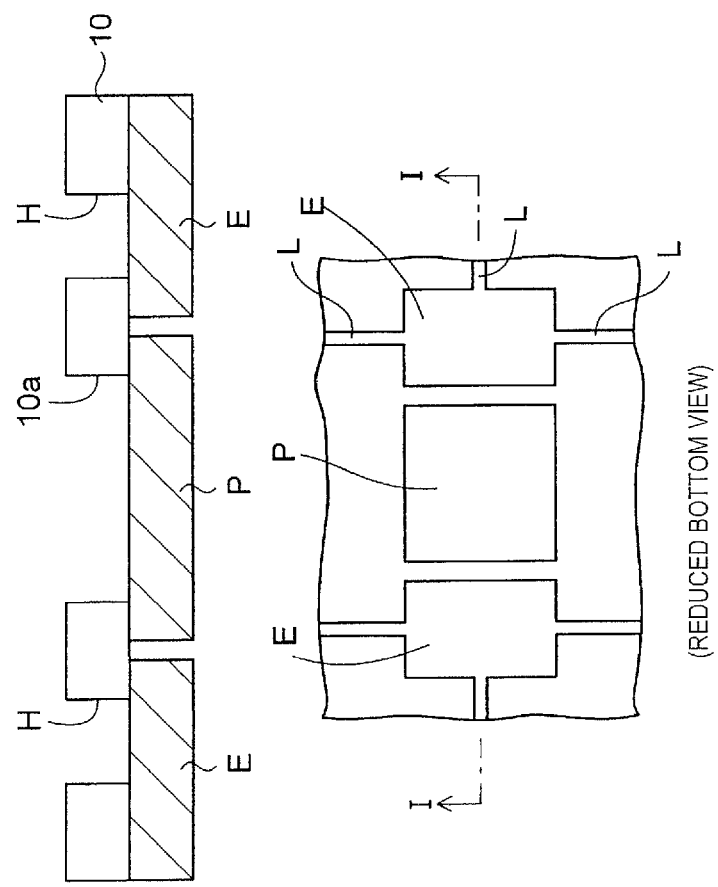
FIG. 6 is a sectional view and a reduced bottom view depicting the method of manufacturing the wiring substrate according to the first exemplary embodiment.

Thereby, as shown in a sectional view and a reduced bottom view of FIG. 6, the copper foil 20 is patterned, so that an electronic component mounting pad P is formed at a central part of one product area and a pair of electrode pads E is formed at outer areas facing each other with the electronic component mounting pad P being interposed therebetween.

The reduced bottom view of FIG. 6 is a pictorial view of the sectional view of FIG. 6, as seen from below. Also, a section taken along a line I-I of the reduced bottom view of FIG. 6 corresponds to the sectional view of FIG. 6.

As shown in the reduced bottom view of FIG. 6, the copper foil 20 is patterned so that a common plating feed line L is connected to the plurality of electrode pads E. The plating feed line L connected to the electrode pads E of FIG. 6 is connected to electrode pads E in other surrounding product areas, so that it is possible to feed power for plating to all the electrode pads E at the same time.

The electronic component mounting pad P is not connected with the plating feed line L and is at a floating state.

Figure 7:
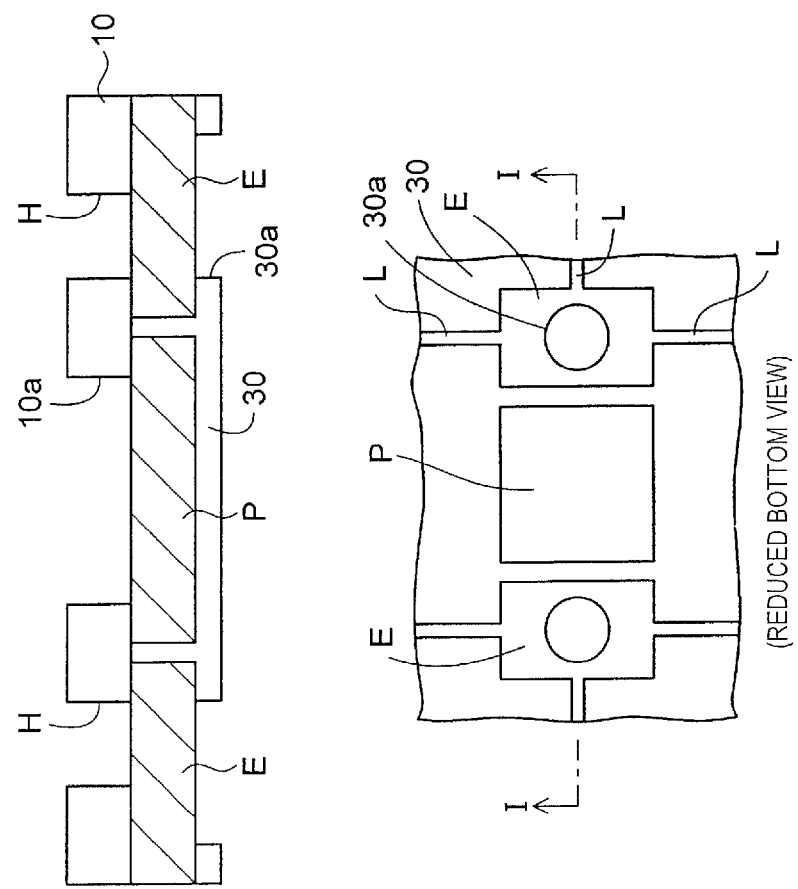
FIG. 7 is a sectional view and a reduced bottom view depicting the method of manufacturing the wiring substrate according to the first exemplary embodiment.

As shown in a sectional view and a reduced bottom view of FIG. 7, the electronic component mounting pad P and the electrode pads E are provided at lower surfaces thereof with a photosensitive solder resist material (not shown) and the exposure and the developing are performed on the basis of the photolithography, so that a solder resist layer 30 is formed. As the solder resist material, an acryl resin, an epoxy-based resin, a polyester-based resin and the like may be used.

The solder resist layer 30 is a favorable example of a second insulation layer. In addition to the solder resist layer 30, a variety of insulation resin layers may be used.

A section taken along a line I-I of the reduced bottom view of FIG. 7 corresponds to the sectional view of FIG. 7. The solder resist layer 30 is formed to have the opening 30a on a lower surface of each electrode pad E. A thickness of the solder resist layer 30 is 10 μm to 30 μm. In the reduced bottom view of FIG. 7, the solder resist layer 30 is perspectivally depicted.

The solder resist layer 30 may be formed by applying a liquid solder resist material or bonding a film-shaped solder resist material.

Figure 8:
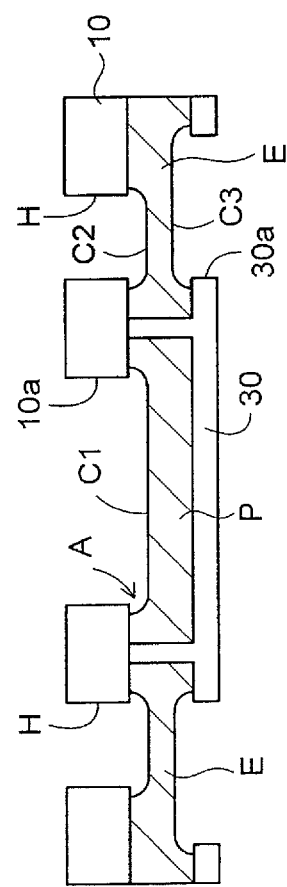
FIG. 8 is a sectional view depicting the method of manufacturing the wiring substrate according to the first exemplary embodiment.

Then, as shown in FIG. 8, the electronic component mounting pad P and the electrode pads E are etched by a wet etchant through the opening 10a and connection holes H of the polyimide film 10 and the openings 30a of the solder resist layer 30.

As the wet etchant of the electronic component mounting pad P and the electrode pads E (the copper foil 20), a copper chloride aqueous solution, a ferric chloride aqueous solution, a sulfuric acid/hydrogen peroxide aqueous solution, an alkali-based etchant or the like is used.

Thereby, the upper surface of the electronic component mounting pad P is etched through the opening 10a of the polyimide film 10, so that a first recess portion C1 is formed. Also, the upper surfaces of the electrode pads E are etched through the connection holes H of the polyimide film 10 are etched, so that second recess portions C2 are formed.

Further, the lower surfaces of the electrode pads E are etched through the openings 30a of the solder resist layer 30, so that third recess portions C3 are formed.

The second recess portion C2 and the third recess portion C3 of the electrode pad E are formed on the upper and lower surfaces of the electrode pad E so as to face each other.

The electronic component mounting pad P and the electrode pads E are isotropically etched by the wet etching. For this reason, as shown in FIG. 8, the first, second and third recess portions C1, C2, C3 have an undercut shape having an encroach part A, which is formed as the side etching is progressed from each inner wall of the opening 10a and the connection hole H of the polyimide film 10 towards an inner side.

Depths of the first, second and third recess portions C1, C2, C3 are set to 5 μm to 10 μm, for example. In a favorable example, the thickness of the copper foil 20 and the depths of the first, second and third recess portions C1, C2, C3 are adjusted so that the final thicknesses of the electronic component mounting pad P and the electrode pad E are within a range of 8 μm to 15 μm.

Since the electrode pad E is formed with the second recess portion C2 and the third recess portion C3 from the upper and lower surfaces, a connection part of the electrode pad E is thinner than the electronic component mounting pad P by the depth of the third recess portion C3.

When bonding the copper foil 20 to the polyimide film 10 in the process of FIG. 4, if the copper foil 20 is extremely thin, a wrinkle is likely to occur in the copper foil 20. When a wrinkle occurs in the copper foil 20, it is difficult to reliably form the electronic component mounting pad P and the electrode pads E.

For this reason, the relatively thick copper foil 20 having a thickness of about 18 μm or greater is bonded to the polyimide film 10, the copper foil 20 is processed to the electronic component mounting pad P and the electrode pads E, and then the electronic component mounting pad P and the electrode pads E are thinned.

In this way, it is possible to reliably form the electronic component mounting pad P and the electrode pads E from the copper foil 20 into a favorable pattern. Further, since the electronic component mounting pad P is formed to be thin, it is possible to thin the wiring substrate.

Figure 9:
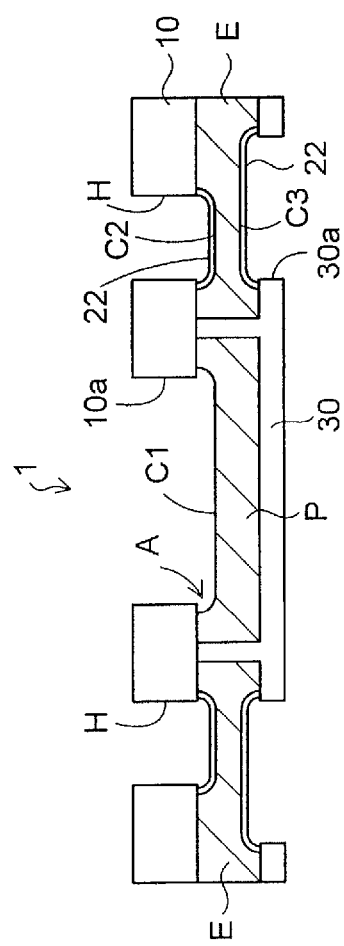
FIG. 9 is a sectional view depicting the wiring substrate according to the first exemplary embodiment.

Then, as shown in FIG. 9, an electrolytic plating is performed by using the plating feed line L of FIG. 6 as a plating feed path, so that the metal is plated on the electrode pads E connected to the plating feed line L.

Thereby, a nickel (Ni)/gold (Au) plated layer 22 as a contact layer is formed on the second recess portions C2 of the upper surfaces of the electrode pads E in the connection holes H of the polyimide film 10.

At the same time, the nickel (Ni)/gold (Au) plated layer 22 as a contact layer is also formed on the third recess portion C3 of the lower surfaces of the electrode pads E in the openings 30a of the solder resist layer 30.

The nickel (Ni)/gold (Au) plated layer 22 is formed by a nickel layer and a gold layer thereon. For example, a thickness of the nickel layer is 1.0 µm to 10 µm, and a thickness of the gold layer is 0.1 µm to 1.0 µm.

Also, as the contact layer, the other plated layer such as nickel (Ni) layer/palladium (Pd) layer/gold (Au) layer may be formed.

Since the electronic component mounting pad P is not connected to the plating feed line L, the electronic component mounting pad P is not formed with a plated layer.

Thereby, as shown in FIG. 9, a wiring substrate 1 of the first exemplary embodiment is obtained. As described below, the wiring substrate 1 is mounted with electronic components and is then cut to obtain each product area. Alternatively, the wiring substrate 1 may be cut before mounting the electronic components thereon.

Figure 10:
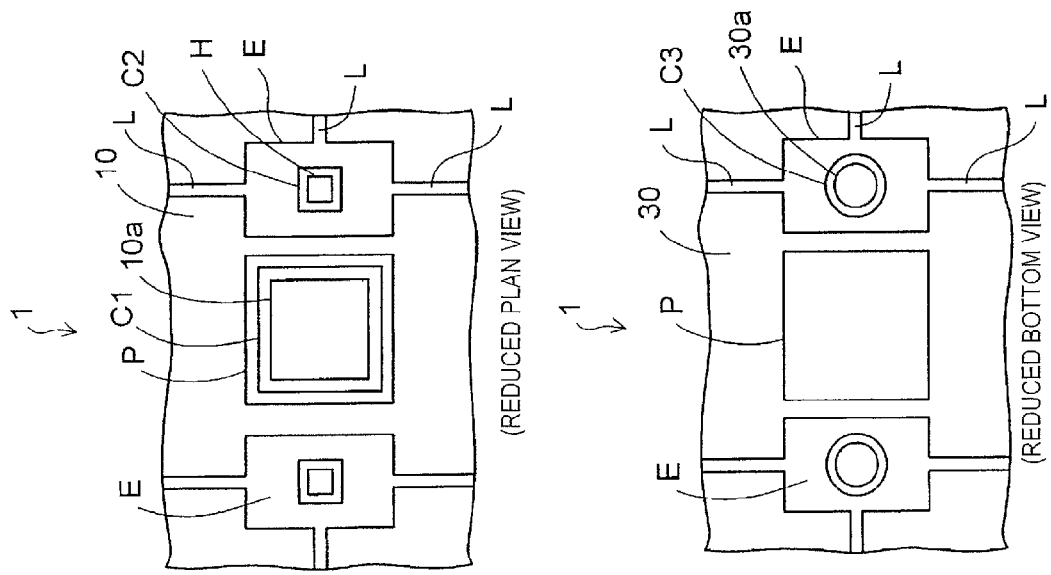
FIG. 10 is a reduced plan view and a reduced bottom view of the wiring substrate of FIG. 9, as seen from above and below, respectively.

FIG. 10 is a reduced plan view and a reduced bottom view of the wiring substrate 1 of FIG. 9, as seen from above and below, respectively. The respective elements of FIG. 10 are perspectively depicted.

As shown in FIG. 9 and the reduced plan view of FIG. 10, the wiring substrate 1 of the first exemplary embodiment has the electronic component mounting pad P and a pair of electrode pads E arranged at the outer areas to face each other with the electronic component mounting pad being interposed therebetween. The electronic component mounting pad P and the electrode pads E are formed by the same layer and are formed by patterning the copper foil 20.

Also, on the electronic component mounting pad P and the electrode pads E, the polyimide film 10 is formed in which the opening 10a is arranged on a main part of the electronic component mounting pad P and the connection holes H are arranged on the connection parts of the electrode pads E. The polyimide film 10 is an example of the first insulation layer.

The electronic component mounting pad P and the electrode pads E are held and integrated by the polyimide film 10 arranged thereon.

Also, as shown in FIG. 9 and the reduced bottom view of FIG. 10, the solder resist layer 30 where the openings 30a are arranged on the connection parts of the electrode pads E is formed below the electronic component mounting pad P and the electrode pads E. The solder resist layer 30 is formed to fill gaps between the electronic component mounting pad P and the electrode pads E.

Like the polyimide film 10, the solder resist layer 30 also has a function of holding the electronic component mounting pad P and the electrode pads E. The solder resist layer 30 is an example of the second insulation layer.

Also, the first recess portion C1 is formed at the electronic component mounting pad P in the opening 10a of the polyimide film 10, so that the electronic component mounting pad P is made to be thin.

Also, the second recess portions C2 are formed on the upper surfaces of the electrode pads E in the connection holes H of the polyimide film 10. Further, the third recess portions C3 are formed on the lower surfaces of the electrode pads E in the openings 30a of the solder resist layer 30.

As described above, the first, second and third recess portions C1, C2, C3 are formed to have an undercut shape having the encroach part A, respectively.

As shown in FIG. 9, peripheral parts of the electronic component mounting pad P and the electrode pads E are covered with the polyimide film 10, so that the recess portion is not formed. Therefore, the peripheral parts have the same thickness as the copper foil 20.

In this way, even when the electronic component mounting pad P and the electrode pads E are made to be thin at the respective central parts thereof, the respective peripheral parts of the electronic component mounting pad P and the electrode pads E secure the thick thickness.

Thereby, it is possible to thin the electronic component mounting pad P and to secure the predetermined stiffness of the wiring substrate 1.

When constructing an electronic component device, an electronic component is mounted on the electronic component mounting pad P so that it protrudes from the upper surface of the polyimide film 10. For this reason, a substantial thickness of the wiring substrate 1 in the electronic component device is a total thickness of the electronic component mounting pad P and the solder resist layer 30.

For example, when the copper foil 20 having a thickness of 18 µm is used and the depth of the first recess portion C1 is set to 5 µm, the thickness of the electronic component mounting pad P is 13 µm, the thickness of the solder resist layer 30 is 10 µm, and the substantial thickness of the wiring substrate 1 is 23 µm.

In this way, the wiring substrate 1 of the exemplary embodiment can be made to be considerably thinner, as compared to the thickness (106 µm) of the wiring substrate 100 according to the preliminary technology.

Subsequently, a method of mounting an electronic component on the wiring substrate 1 (FIG. 9) of the first exemplary embodiment to manufacture an electronic component device is described.

Figure 11:
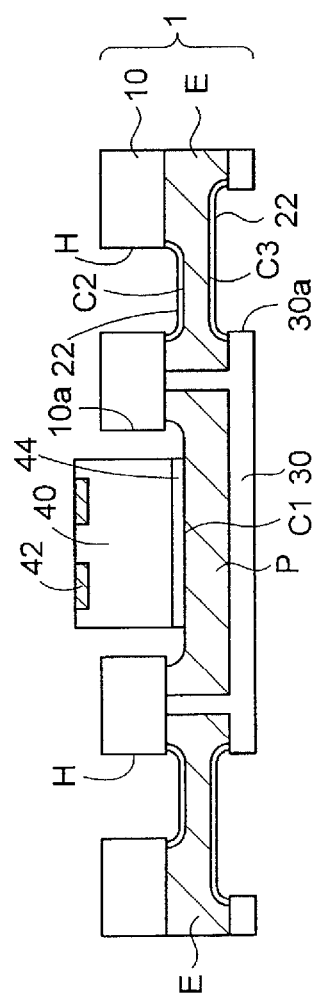
FIG. 11 is a sectional view depicting a method of manufacturing an electronic component device by using the wiring substrate of FIG. 9.

As shown in FIG. 11, an electronic component 40 having connection electrodes 42 on a surface thereof is prepared. A backside of the electronic component 40 is mounted and fixed on the electronic component mounting pad P of the wiring substrate 1 by a die bonding material 44 with the connection electrodes 42 facing upwards. As the die bonding material 44, a resin-based adhesive (for example, an epoxy-based) may be used, for example.

As described above, since a nickel/gold plated layer is not formed on the electronic component mounting pad P, it is possible to strongly bond the electronic component 40 on the electronic component mounting pad P by the die bonding material 44. The reason is that when the resin-based adhesive (for example, the epoxy-based) is used as the die bonding material 44, the die bonding material 44 has the weak adhesiveness with a gold layer and the strong adhesiveness with the electronic component mounting pad P consisting of the copper foil 20.

As a specific example of the electronic component 40, a semiconductor chip, a MEMS (Micro Electro Mechanical Systems) element or the like is used. Alternatively, passive elements such as a capacitor element and a resistance element may be used with being combined.

Figure 12:
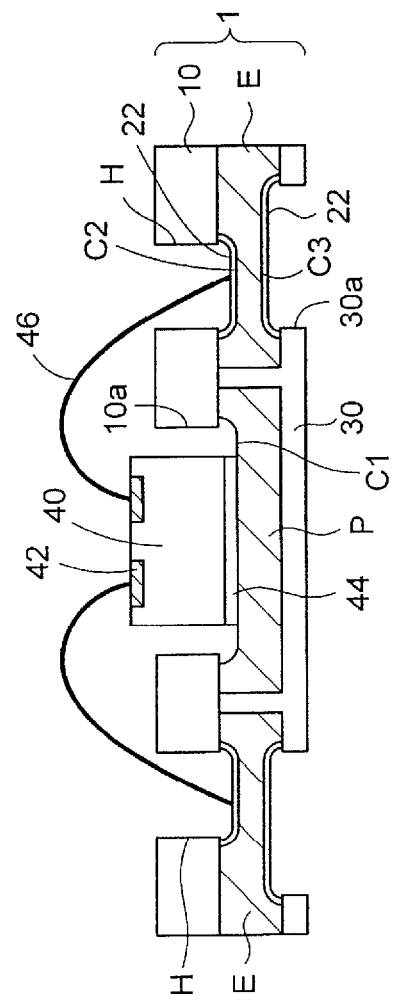
FIG. 12 is a sectional view depicting the method of manufacturing the electronic component device by using the wiring substrate of FIG. 9.

Then, as shown in FIG. 12, the connection electrodes 42 of the electronic component 40 and the electrode pads E of the wiring substrate 1 are electrically connected by metallic wires 46 through a wire bonding method. As the metallic wire 46, a gold (Au) wire, a copper (Cu) wire, a silver (Ag) wire and the like may be used.

As described above, in this exemplary embodiment, the wiring substrate 1 has the predetermined stiffness even though it is made to be thin by forming the first, second and third recess portions C1, C2, C3 at the electronic component mounting pad P and the electrode pads E. For this reason, when connecting the metallic wires 46 to the electrode pads E of the wiring substrate 1 through the wire bonding method, it is possible to reliably perform the connection operation.

Figure 13:
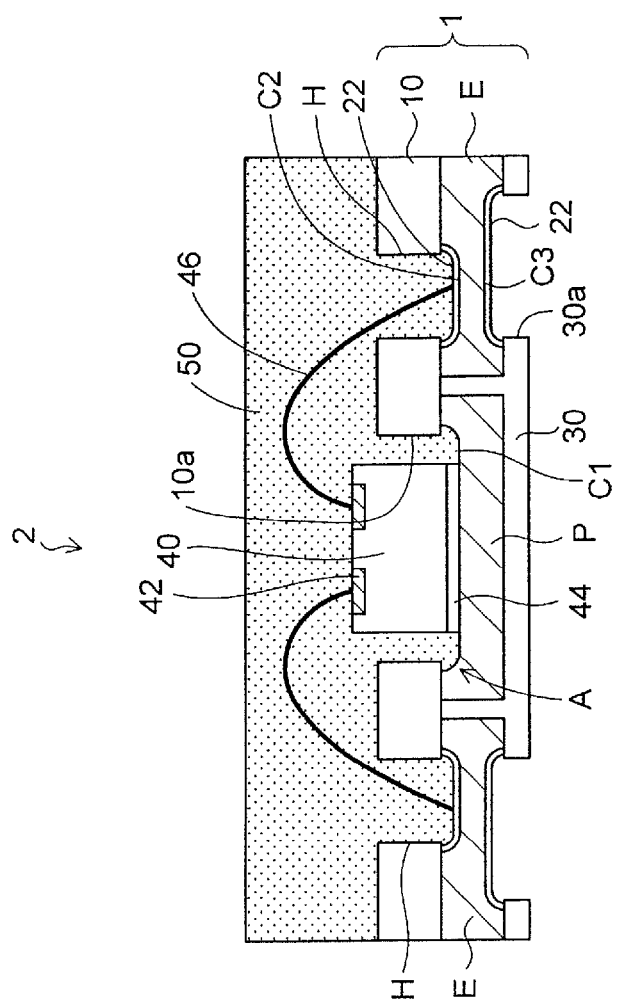
FIG. 13 is a sectional view depicting an electronic component device of the first exemplary embodiment.

Subsequently, as shown in FIG. 13, an encapsulant resin 50 for sealing the wiring substrate 1, the electronic component 40 and the metallic wires 46 is formed by a transfer mold method of injecting a resin into a mold.

As described in the process of FIG. 8, the first, second and third recess portions C1, C2, C3 are formed to have the undercut shape and are provided with the encroach part A from each inner wall of the opening 10a and the connection holes H of the polyimide film 10 towards an inner side.

The encroach parts A are filled with the encapsulant resin 50, so that the encapsulant resin 50 is formed at the wiring substrate 1 with good adhesiveness.

Then, the wiring substrate 1 is cut along a dicing line so as to obtain each product area. Thereby, as shown in FIG. 13, an electronic component device 2 of the first exemplary embodiment is obtained.

In the electronic component device 2 of the first exemplary embodiment, as described in the wiring substrate 1 of FIG. 9, a range from a mount surface of the electronic component mounting pad P on which the electronic component 40 is mounted to the lower surface of the solder resist layer 30 is the substantial thickness of the wiring substrate 1.

Since the mount surface of the electronic component mounting pad P is made to be thin due to the first recess portion C1, it is possible to reduce an entire thickness of the electronic component device 2. Also, since the downsizing of the electronic component 40 is performed, it is possible to make the electronic component device thin, small and light.

In the electronic component device 2 of the first exemplary embodiment, the third recess portion C3 of the lower surface of the electrode pad E of the wiring substrate 1 is provided with an external connection terminal such as a solder ball and is connected to a mounting substrate such as a motherboard.

Figure 14:
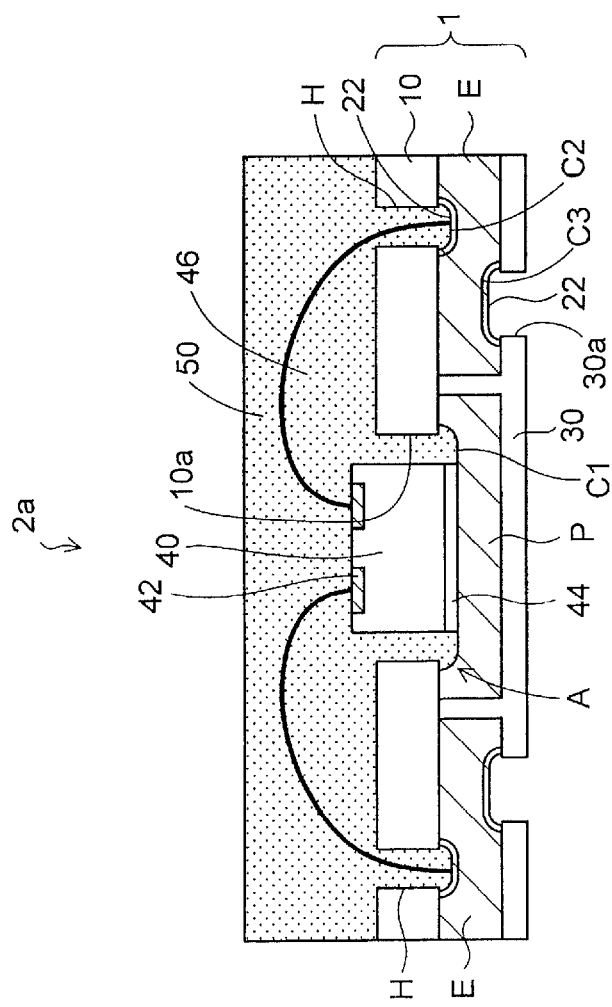
FIG. 14 is a sectional view depicting an electronic component device of a first modified embodiment of the first exemplary embodiment.

FIG. 14 depicts an electronic component device 2a according to a first modified embodiment of the first exemplary embodiment. In the first modified embodiment of FIG. 14, the second recess portion C2 of the upper surface of the electrode pad E of the wiring substrate 1 and the third recess portion C3 of the lower surface thereof are arranged to deviate from each other so that they are positioned in areas, which do not overlap with each other, and the third recess portion C3 is not arranged at a part corresponding to the second recess portion C2 (the position of the second recess portion C2 and the position of the third recess portion C3 in a horizontal direction do not overlap with each other).

In the example of FIG. 14, the third recess portion C3 of the electrode pad E of the wiring substrate 1 is arranged to deviate from the second recess portion C2 towards an inner area. However, to the contrary, the third recess portion C3 may be arranged to deviate from the second recess portion C2 towards an outer area.

Thereby, unlike the wiring substrate 1 of the electronic component device 2 shown in FIG. 9, since the lower surface of the electrode pad E at which the second recess portion C2 is formed is covered with the solder resist layer 30, there is no void below the second recess portion C2.

Therefore, when bonding the metallic wire 46 to the second recess portion C2 of the electrode pad E of the wiring substrate 1, the electrode pad E is not bent even though the second recess portion C2 is formed to be deep. For this reason, it is possible to perform the wire bonding reliably and stably. Since the other elements of FIG. 14 are the same as FIG. 13, they are denoted with the same reference numerals and the descriptions thereof are omitted.

Figure 15:
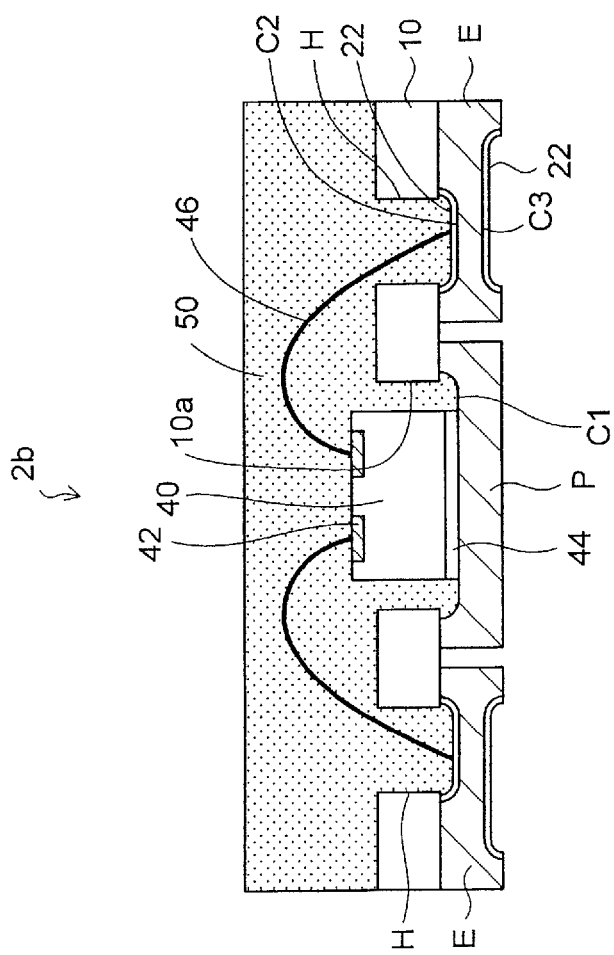
FIG. 15 is a sectional view depicting an electronic component device of a second modified embodiment of the first exemplary embodiment.

FIG. 15 depicts an electronic component device 2b according to a second modified embodiment of the first exemplary embodiment. Like the second modified embodiment of FIG. 15, the solder resist layer 30 may be removed from the wiring substrate 1 of the electronic component device 2 shown in FIG. 13. The other elements of FIG. 15 are the same as FIG. 13.

Figure 16:
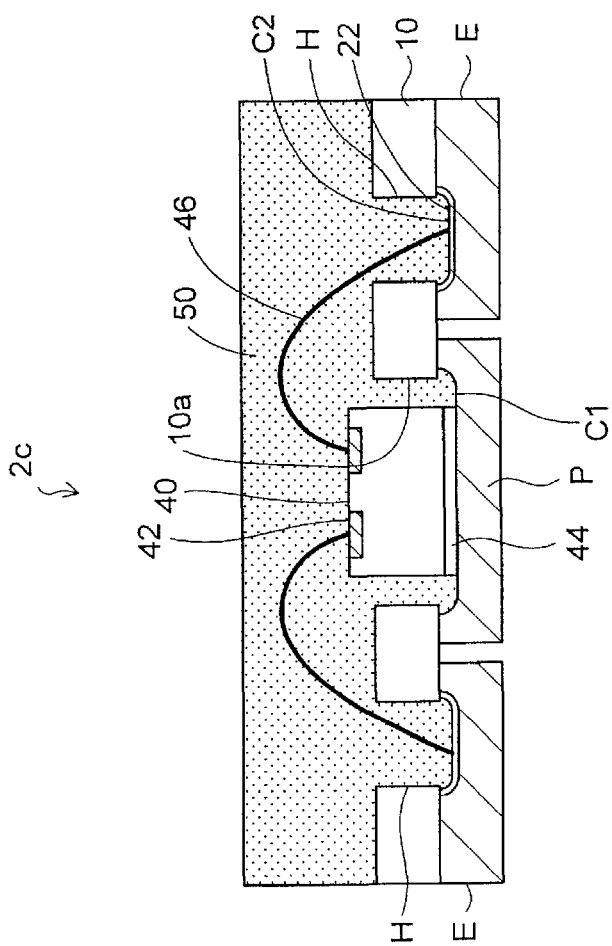
FIG. 16 is a sectional view depicting an electronic component device of a third modified embodiment of the first exemplary embodiment.

FIG. 16 depicts an electronic component device 2c according to a third modified embodiment of the first exemplary embodiment. Like the third modified embodiment of FIG. 16, the solder resist layer 30 may be omitted, the third recess portion C3 may not be formed on the lower surface of the electrode pad E, and the entire lower surface of the electrode pad E may be flat.

In order to manufacture the electronic component device 2c of the third modified embodiment shown in FIG. 16, a protective film is bonded over the entire lower surface, instead of patterning the solder resist layer 30 below the electronic component mounting pad P and the electrode pads E in the process of FIG. 7.

Thereby, during the process of forming the first and second recess portions C1, C2 on the electronic component mounting pad P and the electrode pads E in the process of FIG. 8, the third recess portion C3 is not formed on the lower surface of the electrode pad E.

Further, a nickel/gold plated layer is preferably formed with the protective film being bonded on the entire lower surfaces of the electronic component mounting pad P and the electrode pads E. Then, the protective film is removed. The other elements of FIG. 16 are the same as FIG. 13.

Second Exemplary Embodiment

FIGS. 17 to 20 depict a wiring substrate and an electronic component device of a second exemplary embodiment.

In the wiring substrate 1 (FIG. 9) of the first exemplary embodiment, when an aspect ratio of the connection hole H increases, a capillary of a wire bonding apparatus does not reach the electrode pad E of the bottom of the connection hole H, so that it is difficult to perform the wire bonding. The second exemplary embodiment can solve this problem.

As shown in FIG. 17A, the substantially same structure as the first exemplary embodiment shown in FIG. 8 is prepared. FIG. 17A is different from FIG. 8, in that the aspect ratio of the connection hole H of the polyimide film 10 is greater.

In the example of FIG. 17A, the polyimide film 10 is thickened and a diameter of the connection hole H is reduced, so that the aspect ratio of the connection hole H is increased.

Then, as shown in FIG. 17B, the protective film 14 is bonded to the lower surface of the solder resist layer 30. Then, like the process of FIG. 9 of the first exemplary embodiment, the electrolytic plating is performed by using the plating feed line L as the plating feed path, so that a copper-plated layer 24 is formed on the electrode pad E in the connection hole H.

Thereby, the connection hole H of the polyimide film 10 is filled with the copper-plated layer 24. Preferably, the connection hole H is completely filled with the copper-plated layer 24 so that an upper surface of the copper-plated layer 24 is flush with the upper surface of the polyimide film 10.

Figure 18:
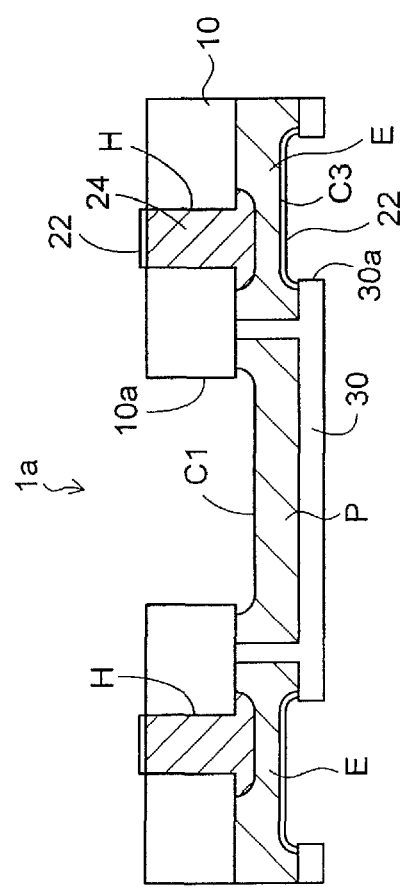
FIG. 18 is a sectional view depicting a wiring substrate of the second exemplary embodiment.
Figure 19:
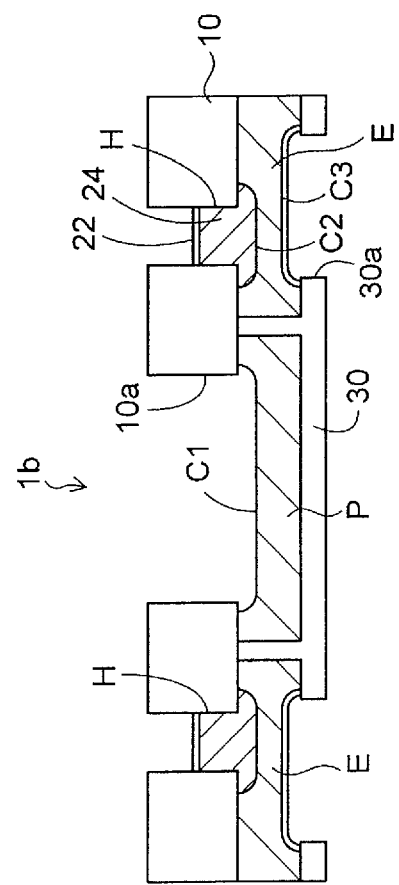
FIG. 19 is a sectional view depicting a wiring substrate of a modified embodiment of the second exemplary embodiment.

Subsequently, as shown in FIG. 18, after removing the protective film 14, nickel/gold plated layers 22 are formed on the copper-plated layer 24 and the lower surface of the electrode pad E by the same electrolytic plating. Thereby, a wiring substrate 1a of the second exemplary embodiment is obtained.

Alternatively, like a wiring substrate 1b (FIG. 19) of a modified embodiment, when forming the copper-plated layer 24 on the electrode pad E in the connection hole H of the polyimide film 10, the copper-plated layer 24 may be formed up to a part of the depth of the connection hole H. Then, the nickel/gold plated layers 22 are formed on the copper-plated layer 24 and the lower surface of the electrode pad E by the same method.

Figure 20:
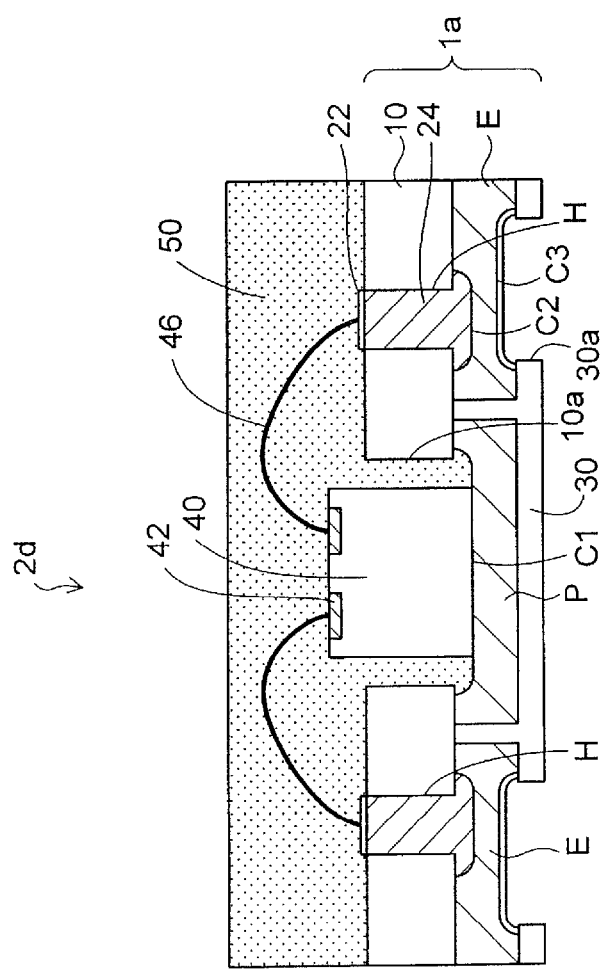
FIG. 20 is a sectional view depicting an electronic component device of the second exemplary embodiment.

Then, as shown in FIG. 20, like the processes of FIGS. 11 to 13 of the first exemplary embodiment, the electronic component 40 is mounted on the electronic component mounting pad P of the wiring substrate 1a shown in FIG. 18. Also, the connection electrodes 42 of the electronic component 40 and the electrode pads E of the wiring substrate 1 are connected by the metallic wires 46.

Then, the encapsulant resin 50 for sealing the wiring substrate 1a, the electronic component 40 and the metallic wires 46 is formed. Thereby, an electronic component device 2d of the second exemplary embodiment is obtained.

In the wiring substrate 1a of the second exemplary embodiment, the nickel/gold plated layer 22, which is a bonding surface of the metallic wire 46, is lifted up from the electrode pad E to the upper surface of the polyimide film 10 by the copper-plated layer 24.

Thereby, since the tip end of the capillary of the wire bonding apparatus can easily reach the nickel/gold plated layer 22, irrespective of the aspect ratio of the connection hole H, it is possible to improve the wire bonding characteristics.

Also in the wiring substrate 1b (FIG. 19) of the modified embodiment, since the aspect ratio of the connection hole H is considerably reduced, it is possible to improve the wire bonding characteristics.

Third Exemplary Embodiment

Figure 21:
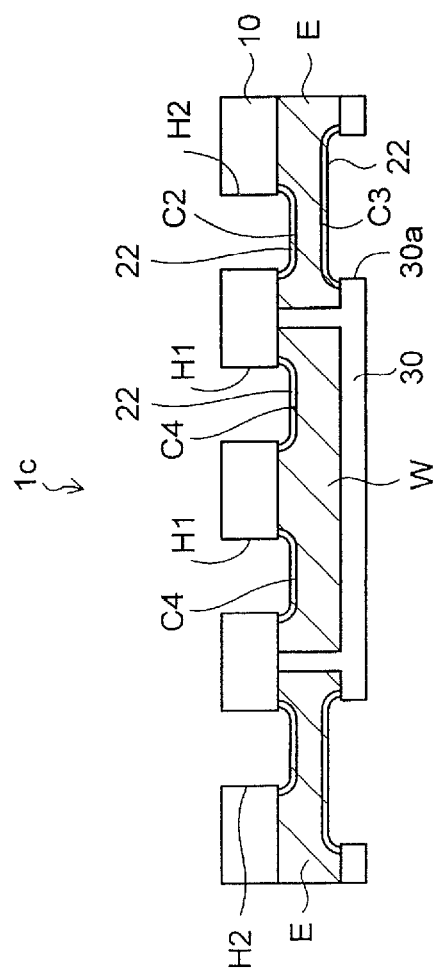
FIG. 21 is a sectional view depicting a wiring substrate of a third exemplary embodiment.
Figure 22:
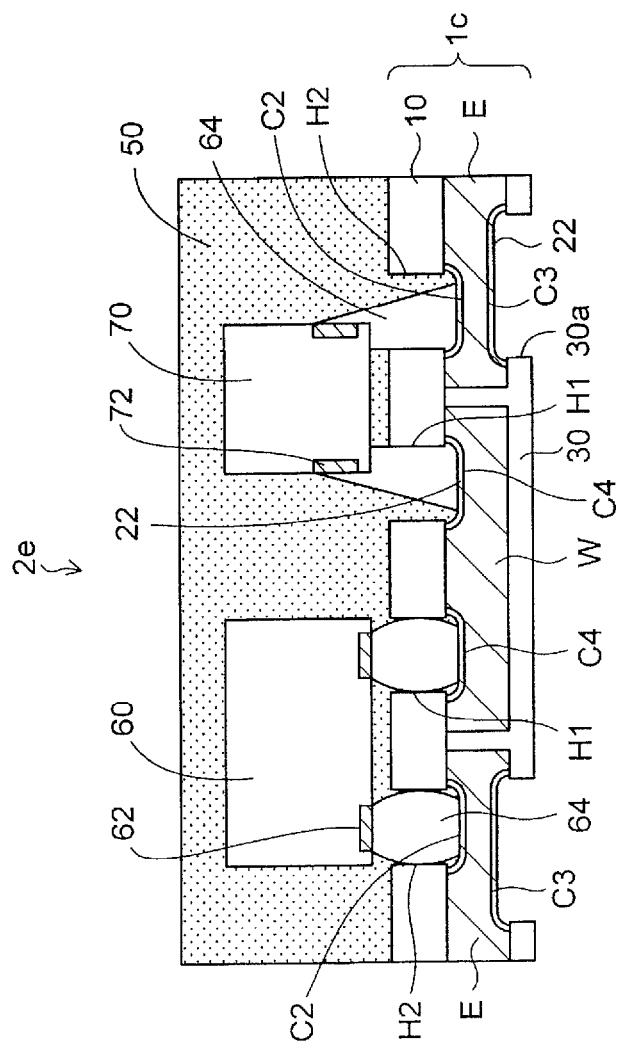
FIG. 22 is a sectional view depicting an electronic component device of the third exemplary embodiment.
Figure 23:
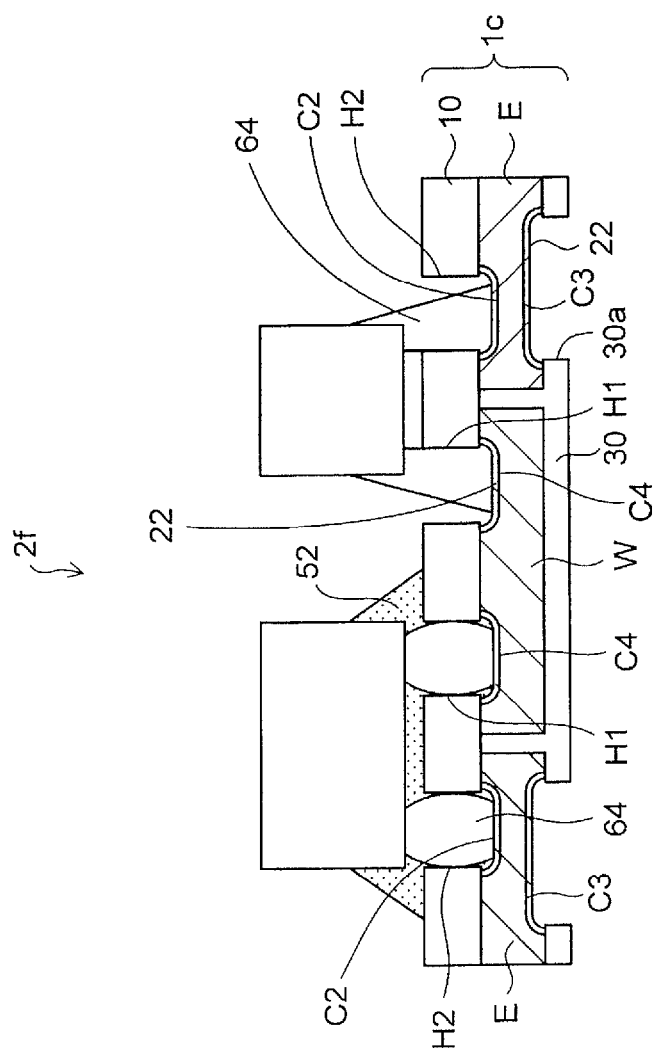
FIG. 23 is a sectional view depicting an electronic component device of a modified embodiment of the third exemplary embodiment.

FIGS. 21 to 23 depict a wiring substrate and an electronic component device of a third exemplary embodiment.

The wiring substrate of the third exemplary embodiment is a wiring substrate to which an electronic component is to be flip-chip connected.

As shown in FIG. 21, in a wiring substrate 1c of the third exemplary embodiment, the electronic component mounting pad P of the wiring substrate 1 (FIG. 9) of the first exemplary embodiment is formed as a wiring part W, and a pair of electrode pads E is arranged at outer sides of the wiring part W.

First connection holes H1 of the polyimide film 10 are arranged on the wiring part W, and second connection holes H2 of the polyimide film 10 are arranged on the electrode pads E.

Also, fourth recess portions C4 are formed at the wiring part W in the first connection holes H1 of the polyimide film 10. The nickel/gold plated layer 22 is also formed on the fourth recess portions C4 of the wiring part W.

The other elements of the wiring substrate 1c shown in FIG. 21 are the same as the wiring substrate 1 (FIG. 9) of the first exemplary embodiment.

In order to manufacture the wiring substrate 1c of the third exemplary embodiment, the polyimide film 10 (first insulation layer) is first formed with the first connection holes H1 and the second connection holes H2 in the process of FIG. 3 of the first exemplary embodiment.

Then, in the processes of FIGS. 5 and 6, the copper foil 20 is patterned to arrange the wiring part W in an area including the first connection holes H1 and to arrange the electrode pads E in an area including the second connection holes H2. Also, like the first exemplary embodiment, the lower surfaces of the wiring part W and the electrode pads E are formed with the solder resist layer 30 (second insulation layer) having the openings 30a on the electrode pads E.

By the same method, the fourth recess portions C4 are formed at the wiring part W in the first connection holes H1 of the polyimide film 10, and the second recess portions C2 are formed on the upper surfaces of the electrode pads E in the second connection holes H2. At the same time, the third recess portions C3 are formed on the lower surfaces of the electrode pads E in the openings 30a of the solder resist layer 30.

Then, the nickel/gold plated layers 22 are formed on the fourth recess portions C4 of the wiring part W and the second recess portions C2 and third recess portions C3 of both surfaces of the electrode pads E. In the third exemplary embodiment, the plating feed line is connected to the wiring part W, too, so that the metal plating is performed for the fourth recess portions C4 of the wiring part W at the same time.

Also in the wiring substrate 1c of the third exemplary embodiment, the same modified embodiments as the first exemplary embodiment may be adopted.

Also, as shown in FIG. 22, as the electronic component, a semiconductor chip 60 having connection electrodes 62 on a lower surface thereof is prepared. The connection electrodes 62 of the semiconductor chip 60 are flip-chip connected to one of the fourth recess portions C4 of the wiring parts W in the first connection holes H1 and to one of the second recess portions C2 of the electrode pads E in the second connection holes H2 of the wiring substrate 1c, via solders 64.

Also, a capacitor element 70 having connection electrodes 72 on both end surfaces in a horizontal direction is prepared. The connection electrodes 72 on both end surfaces of the capacitor element 70 are connected to the other of the fourth recess portions C4 of the wiring parts W in the first connection holes H1 and to the other of the second recess portions C2 of the electrode pads E in the second connection holes H2 of the wiring substrate 1c, via solders 64.

In this way, the semiconductor chip 60 is electrically connected to the capacitor element 70 via the wiring part W of the wiring substrate 1c. In addition to the capacitor element 70, the other passive components such as a resistance element may also be connected.

On the upper surface of the wiring substrate 1c, the semiconductor chip 60 and the capacitor element 70 are sealed by the encapsulant resin 50.

Thereby, as shown in FIG. 22, an electronic component device 2e of the third exemplary embodiment is constructed.

Like an electronic component device 2f of a modified embodiment shown in FIG. 23, gaps between the semiconductor chip 60 and the wiring substrate 1c may be sealed by an underfill resin 52, instead of the encapsulant resin 50.

In the electronic component devices 2e, 2f of the third exemplary embodiment, the fourth recess portions C4 are formed at the wiring part W in the first connection holes H1 of the polyimide film 10, and the second recess portions C2 are formed at the electrode pads E in the second connection holes H2, so that the thickness of each connection part is made to be thin.

The semiconductor chip 60 is flip-chip connected to each connection part in which the wiring part W and the electrode pad E are made to be thin.

Thereby, the height positions of the connection parts in the first and second connection holes H1, H2 of the thin wiring substrate 1c manufactured using the copper foil 20 are further lowered by the depths of the second and fourth recess portions C2, C4. For this reason, since it is possible to lower the height position of the mounted semiconductor chip 60, it is possible to reduce the entire thickness of the electronic component device.

Figure 24:
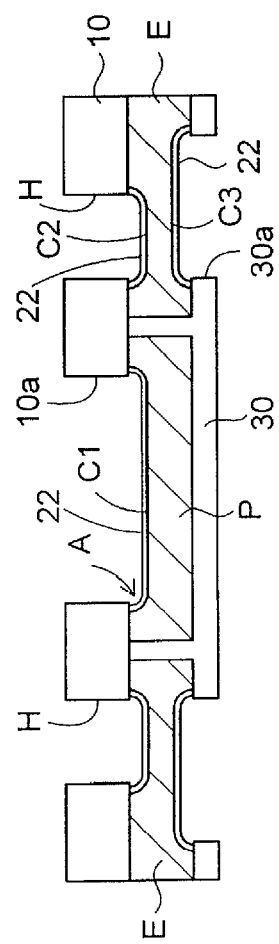
FIG. 24 is a sectional view depicting a wiring substrate according to a modified embodiment.
Figure 25:
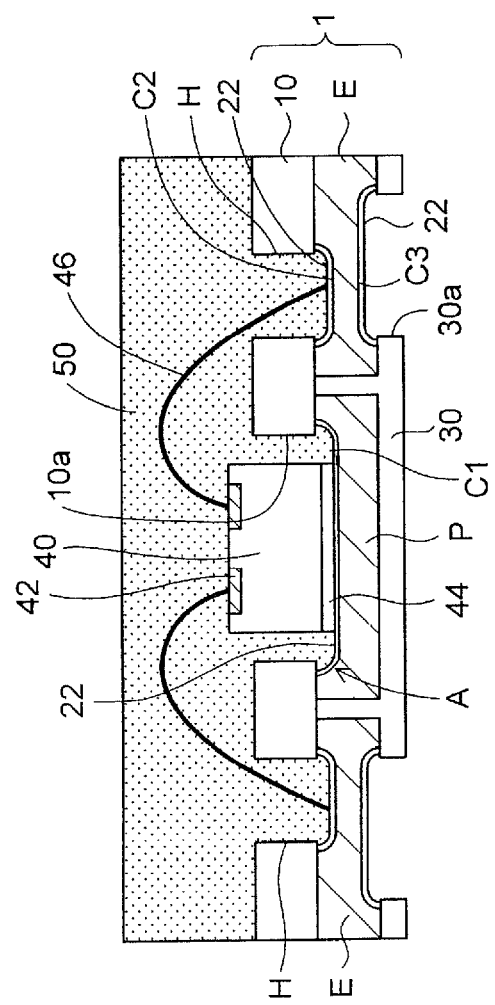
FIG. 25 is a sectional view depicting an electronic component device of a modified embodiment.

In the above embodiments, the electronic component mounting pad P is not formed with a plated layer; however, the present invention is not limited to these embodiments. More specifically, as shown in FIGS. 24 and 25, the electronic component mounting pad P may be formed with a plated layer 22. In this case, the copper foil 20 is patterned so that the common plating feed line L is connected to the plurality of electrode pads E and the electronic component mounting pad P in the process shown in FIGS. 5 and 6, and then, an electrolytic plating is performed by using the plating feed line L as a plating feed path in the process shown in FIG. 9, so that the metal is plated on the electrode pads E and the electronic component mounting pad P connected to the plating feed line L. For example, when the solder is used as the die bonding material 44 for mounting the electronic component 40 on the electronic component mounting pad P, the bonding strength of the die bonding material 44 can be improved by providing the plated layer 22 on the electronic component mounting pad P.

[Clauses]

This disclosure further encompasses various exemplary embodiments, for example, described below.

1. A method of manufacturing a wiring substrate, the method comprising:

forming an opening and a connection hole at an outer side of the opening in a resin film by a penetrating process;

bonding a metal foil to one surface of the resin film;

patterning the metal foil to arrange an electronic component mounting pad in an area comprising the opening of the resin film and to arrange an electrode pad in an area comprising the connection hole of the resin film; and forming recess portions at the electronic component mounting pad in the opening of the resin film and at the electrode pad in the connection hole of the resin film, respectively.

2. A method of manufacturing a wiring substrate, the method comprising:

forming a connection hole in a resin film by a penetrating process;

bonding a metal foil to one surface of the resin film;

patterning the metal foil to arrange an electrode pad in an area comprising the connection hole of the resin film; and forming a recess portion at the electrode pad in the connection hole of the resin film.

3. The method according to claim 1, further comprising:

forming a second insulation layer having an opening on the electrode pad on surfaces of the electronic component mounting pad and the electrode pad opposite to the surface having the resin film bonded thereto after the patterning the metal foil, wherein in the forming the recess portion, a recess portion is formed at the electrode pad in the opening of the second insulation layer at the same time.

4. The method according to claim 2, further comprising:

forming a second insulation layer having an opening on the electrode pad on a surface of the electrode pad opposite to the surface having the resin film bonded thereto after the patterning the metal foil, wherein in the forming the recess portion, a recess portion is formed at the electrode pad in the opening of the second insulation layer at the same time.

What is claimed is:

1. A wiring substrate comprising:
   an electronic component mounting pad;
   an electrode pad arranged at an outer side of the electronic component mounting pad;
   a first insulation layer formed on the electronic component mounting pad and the electrode pad;
   an opening formed in the first insulation layer on the electronic component mounting pad;
   a connection hole formed in the first insulation layer on the electrode pad; and
   recess portions formed at the electronic component mounting pad in the opening and at the electrode pad in the connection hole, respectively, the recess portions each including an undercut portion that is overlaid by the first insulation layer.

2. The wiring substrate according to claim 1, wherein the electronic component mounting pad and the electrode pad are formed of a metal foil.

3. The wiring substrate according to claim 1, wherein the first insulation layer is a resin film.

4. The wiring substrate according to claim 1, wherein a metal-plated layer is formed on the electrode pad in the connection hole.

5. An electronic component device comprising:
   the wiring substrate according to claim 1;
   an electronic component mounted on the electronic component mounting pad; and
   a metallic wire connecting the electronic component and the electrode pad each other.

6. The wiring substrate according to claim 1, wherein the undercut portion of the recess portion formed at the electronic component mounting pad is provided at each inner wall of the first insulation layer defining the opening, and the undercut portion of the recess portion formed at the electrode pad is provided at an inner side wall of the first insulation layer defining the connection hole.

7. A wiring substrate comprising:
   an electrode pad;
   a first insulation layer formed on the electrode pad;
   a connection hole formed in the first insulation layer on the electrode pad; and
   a recess portion formed at the electrode pad in the connection hole, the recess portion including an undercut portion that is overlaid by the first insulation layer.

8. The wiring substrate according to claim 7, wherein the first insulation layer is a resin film.

9. The wiring substrate according to claim 7, wherein a metal-plated layer is formed on the electrode pad in the connection hole.

10. An electronic component device comprising:
    the wiring substrate according to claim 7; and
    an electronic component flip-chip connected to the recess portion of the electrode pad in the connection hole.

11. A wiring substrate comprising:
    an electronic component mounting pad;
    an electrode pad arranged at an outer side of the electronic component mounting pad;

a first insulation layer formed on the electronic component mounting pad and the electrode pad;

an opening formed in the first insulation layer on the electronic component mounting pad;

a connection hole formed in the first insulation layer on the electrode pad;

first recess portions formed at the electronic component mounting pad in the opening and at the electrode pad in the connection hole, respectively;

a second insulation layer formed below the electronic component mounting pad and the electrode pad;

an opening formed in the second insulation layer below the electrode pad; and a second recess portion formed at the electrode pad in the opening of the second insulation layer.

12. The wiring substrate according to claim 11, wherein the first recess portion formed at the electrode pad in the connection hole of the first insulation layer and the second recess portion formed at the electrode pad in the opening of the second insulation layer are arranged to deviate from each other so that they are positioned in areas, which do not overlap with each other.

\* \* \* \* \*